United States Patent
Lin et al.

(10) Patent No.: US 9,331,033 B1
(45) Date of Patent: May 3, 2016

(54) METHOD FOR FORMING STACKED METAL CONTACT IN ELECTRICAL COMMUNICATION WITH ALUMINUM WIRING IN SEMICONDUCTOR WAFER OF INTEGRATED CIRCUIT

(71) Applicant: SunASIC Technologies, Inc., New Taipei (TW)

(72) Inventors: Chi-Chou Lin, New Taipei (TW); Zheng-Ping He, Taipei (TW)

(73) Assignee: Sunasic Technologies Inc., New Taipei (TW)

( * ) Notice: Subject to any disclaimer, the term of this patent is extended or adjusted under 35 U.S.C. 154(b) by 0 days.

(21) Appl. No.: 14/580,960

(22) Filed: Dec. 23, 2014

(51) Int. Cl.
*H01L 23/00* (2006.01)
*H01L 21/3213* (2006.01)
*H01L 23/04* (2006.01)

(52) U.S. Cl.
CPC .......... *H01L 24/03* (2013.01); *H01L 21/32134* (2013.01); *H01L 23/04* (2013.01); *H01L 24/05* (2013.01); *H01L 24/27* (2013.01); *H01L 2224/03916* (2013.01); *H01L 2224/0401* (2013.01); *H01L 2224/04042* (2013.01); *H01L 2924/0103* (2013.01); *H01L 2924/01022* (2013.01); *H01L 2924/01024* (2013.01); *H01L 2924/01073* (2013.01); *H01L 2924/01074* (2013.01); *H01L 2924/0493* (2013.01); *H01L 2924/04953* (2013.01)

(58) Field of Classification Search
CPC ........................................................ H01L 24/27
See application file for complete search history.

(56) References Cited

U.S. PATENT DOCUMENTS

| | | | |
|---|---|---|---|
| 2005/0074959 A1* | 4/2005 | Burrell | H01L 23/3192 438/617 |
| 2005/0212130 A1* | 9/2005 | Imai | H01L 24/11 257/737 |
| 2008/0136018 A1* | 6/2008 | Kato | H01L 24/11 257/737 |

* cited by examiner

*Primary Examiner* — Ha Tran T Nguyen
*Assistant Examiner* — Aaron Dehne
(74) *Attorney, Agent, or Firm* — Che-Yang Chen; Law Office of Scott Warmuth

(57) ABSTRACT

A method for forming a stacked metal contact in electrical communication with aluminum wiring in a semiconductor wafer of an integrated circuit is disclosed. The method includes the steps of: forming at least one passivation layer on a surface of the semiconductor wafer of the integrated circuit, where an aluminum wiring is embedded; forming a patterned terminal via opening through the passivation layer to expose the aluminum wiring; removing a portion of the aluminum wiring from the patterned terminal via opening by chemical etching and forming a thin zinc film on an etched surface at the same time; forming a nickel film stacked on the zinc film; and; and forming a metal stack in the patterned terminal via opening and/or at least a portion of the passivation layer by chemical plating or metal plating.

13 Claims, 13 Drawing Sheets

US 9,331,033 B1

METHOD FOR FORMING STACKED METAL CONTACT IN ELECTRICAL COMMUNICATION WITH ALUMINUM WIRING IN SEMICONDUCTOR WAFER OF INTEGRATED CIRCUIT

FIELD OF THE INVENTION

The present invention relates to a method for forming a stacked metal contact. More particularly, the present invention relates to a method for forming a stacked metal contact in electrical communication with an aluminum wiring in semiconductor wafer of an integrated circuit.

BACKGROUND OF THE INVENTION

Copper process or aluminum process is the main step for forming interconnects (wirings) in an integrated circuit (IC). For copper, its resistivity ($\rho_{Cu}$=1.7 μΩ-cm) is 40% lower than that of aluminum ($\rho_{Al}$=2.7 μΩ-cm) and 50% lower than that of copper and aluminum alloys ($\rho_{Al-Cu(0.5\ at\ \%)}$=2.9~3.3 μΩ-cm). Therefore, copper wirings used as interconnects in ICs can effectively reduce RC delay. In addition, copper has better electromigration and stress-void resistance than aluminum. Comparing with the aluminum process, copper process has an advantage in cost.

However, copper wirings have below defects. Copper is not able to form fluorides and chlorides under 200-300° C. so that plasma etching is not easily processed. Besides, copper can not form a dense and passivated protective oxide layer over its surface. Copper atoms will fast spread into $S_iO_2$ by heat or bias diffusion and build up deep impurity levels. Adhesion between copper and $S_iO_2$ is not as good as that between aluminum and $S_iO_2$. Most of all, copper easily reacts with silicon so as to produce Cu—Si compounds. This changes the designed characteristics of the ICs and causes worse performance. Hence, many interconnects of ICs are still made of aluminum wiring.

However, aluminum has low adhesive ability to connect with other metals. Many methods are provided for forming an electrical interconnection between the aluminum wiring and a copper bonding pad. A commonly used means is illustrated through FIG. 1A to FIG. 1C. A semiconductor wafer 1 of an IC has an aluminum wiring 2 formed on one surface. Then, a passivation layer 3 is formed to cover the semiconductor wafer 1 and the aluminum wiring 2. An etching process is carried on to expose the aluminum wiring 2. Finally, a copper pad 4 is formed on the aluminum wiring 2 and partial semiconductor wafer 1.

Conventionally, in a fab, the etching process can be any wet etching or dry etching. The copper pad 4 may be formed by Chemical Vapor Deposition (CVD) or Physical Vapor Deposition (PVD). As one can know that these processes are complex and expensive. Meanwhile, the connection of copper and aluminum is not so firm and stable. Due to difference of coefficients of thermal expansion of copper and aluminum, the interface of the two metals may split under high temperature, e. g. when the IC is working. Although there are many prior arts, for example, the U.S. Pat. No. 6,756,298, disclosing specified methods to deal with adjoining of copper and aluminum for the structure of a bonding pad of an IC, the achievement will just increase the manufacturing cost. For ICs that don't need to be made under advanced manufacturing processes, it is necessary to find a simple, effective and cheap way to form the bonding pad (copper contact) over an aluminum wiring in the ICs.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method for forming a stacked metal contact in electrical communication with aluminum wiring in a semiconductor wafer of an integrated circuit includes the steps of: forming at least one passivation layer on a surface of the semiconductor wafer of the integrated circuit, where an aluminum wiring is embedded; forming a patterned terminal via opening through the passivation layer to expose the aluminum wiring; removing a portion of the aluminum wiring from the patterned terminal via opening by chemical etching and forming a thin zinc film on an etched surface at the same time; forming a nickel film stacked on the zinc film; and; and forming a metal stack in the patterned terminal via opening and/or at least a portion of the passivation layer by chemical plating or metal plating. The semiconductor wafer has a barrier layer beneath the aluminum wiring.

Preferably, the passivation layer is made of $SiO_2$, $Si_3N_4$, SiN or a combination thereof. The aluminum wiring has a volume large enough so that after the chemical etching is processed, remained portion of the aluminum wiring still functions normally for the integrated circuit. Thickness of the aluminum wiring is greater than 1 μm. Any point in the cross-section of peripheral of the aluminum wiring is at least 5 μm apart from a closest point in the patterned terminal via opening. The chemical etching is processed by using alkaline zincate solution. The chemical etching etches out a portion of aluminum wiring between the passivation layer and the barrier layer. The aluminum wiring is made of aluminum or aluminum alloy. The barrier layer is made of TaN, TiN, Cr, Ta, W, Ti or combinations thereof. The nickel film is formed by electroplating or electro less plating. The metal stack is made of gold, silver, titanium, chromium, copper or copper alloy.

The method further includes a step of: forming an electrical interconnection from the metal stack. Preferably, the electrical interconnection is metal plating. In practice, the electrical interconnection is conductive paste or conductive ink. The electrical interconnection can also be wirebonding or metal bump.

DETAILED DESCRIPTION OF THE PREFERRED EMBODIMENTS

The present invention will now be described more specifically with reference to the following embodiments.

Figure 1A:
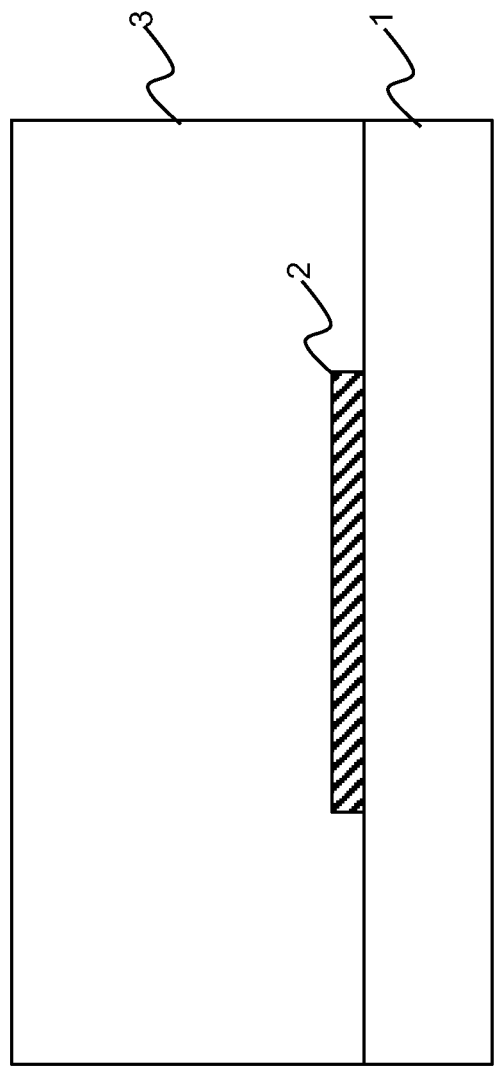
FIGS. 1A to 1C illustrate a conventional method to form an electrical interconnection between an aluminum wiring and a copper bonding pad.
Figure 1B:
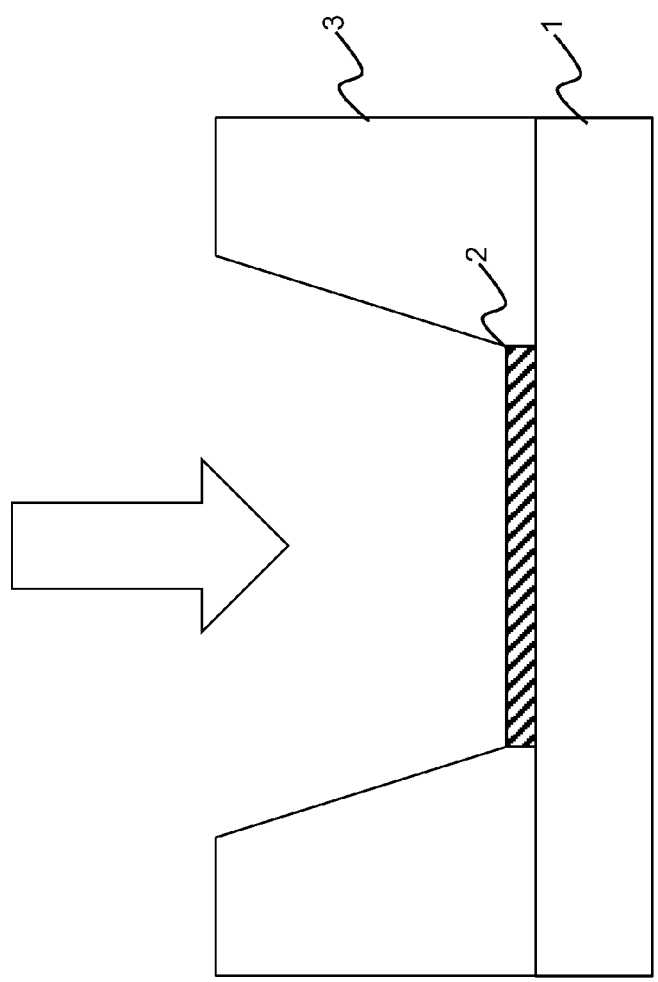
Figure 1C:
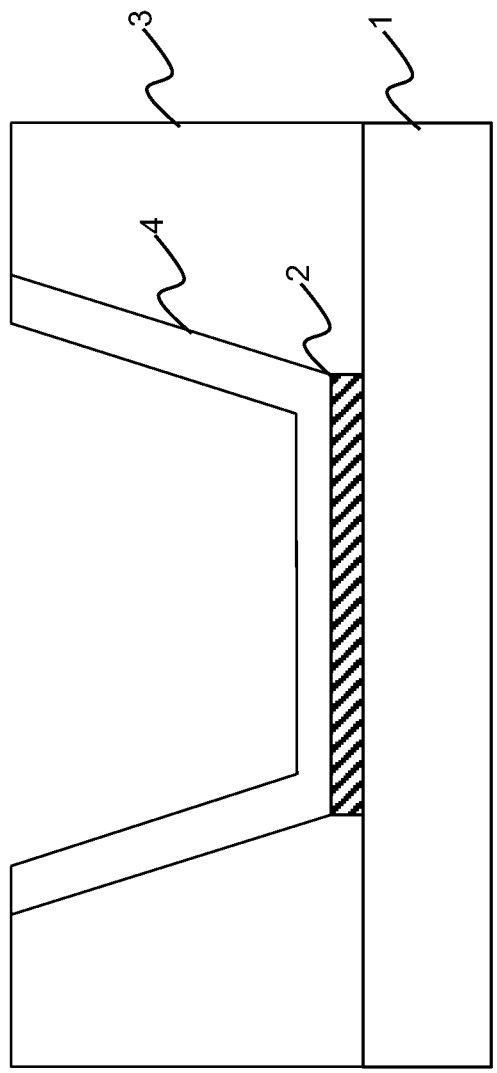
Figure 2:
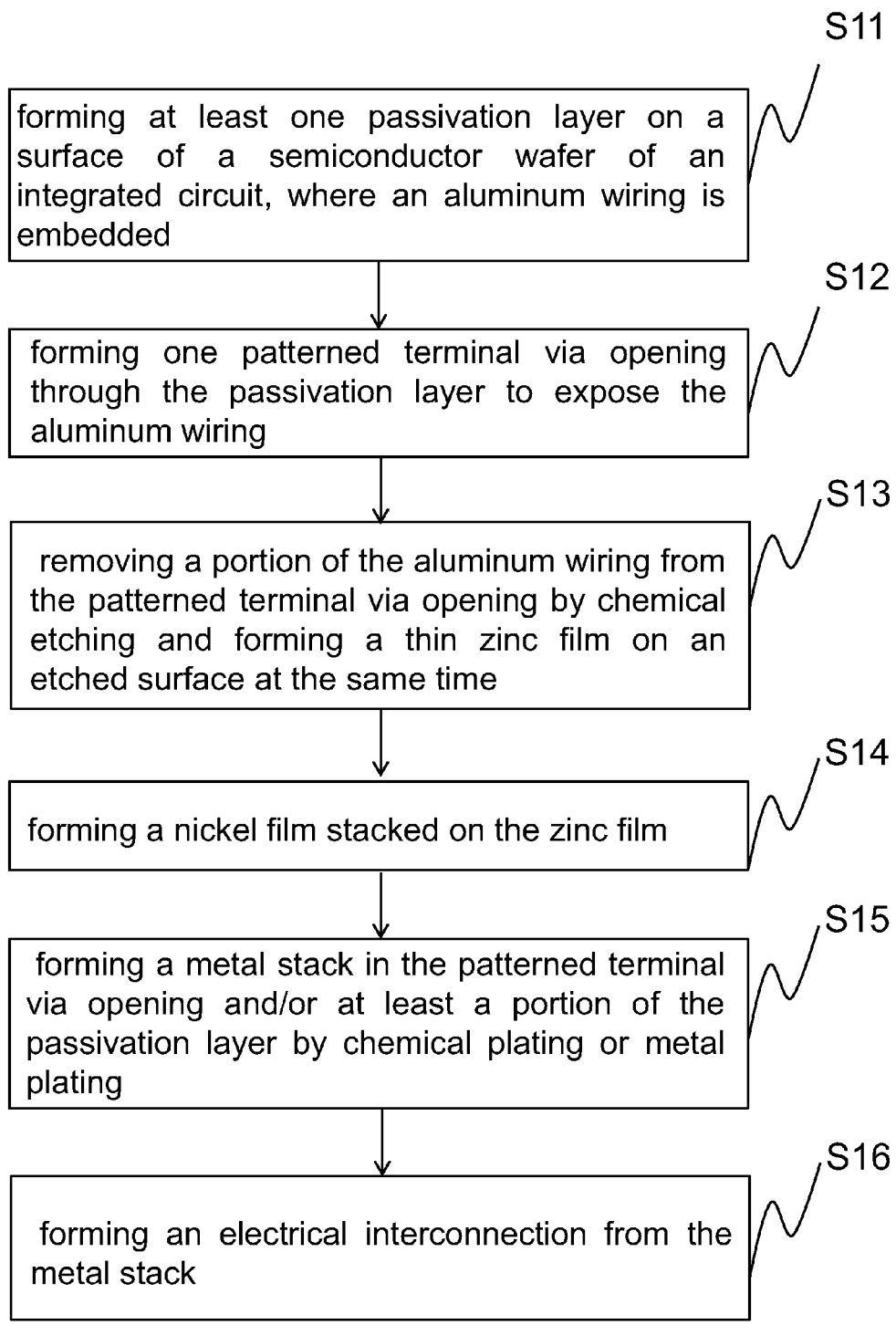
FIG. 2 is a flow chart of a method for forming a stacked metal contact in electrical communication with aluminum wiring in a semiconductor wafer of an integrated circuit according to the present invention.
Figure 3:
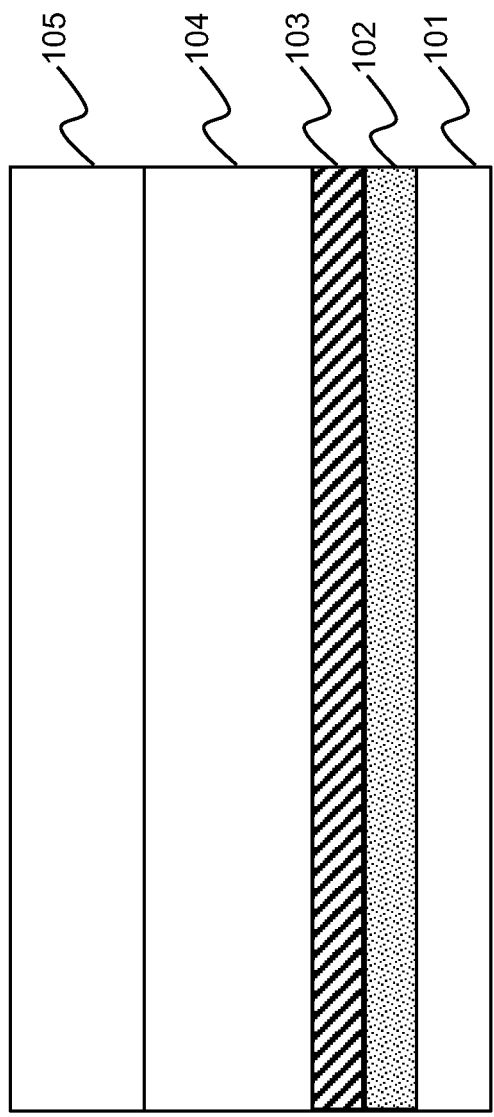
FIG. 3 shows a step of the method.
Figure 4:
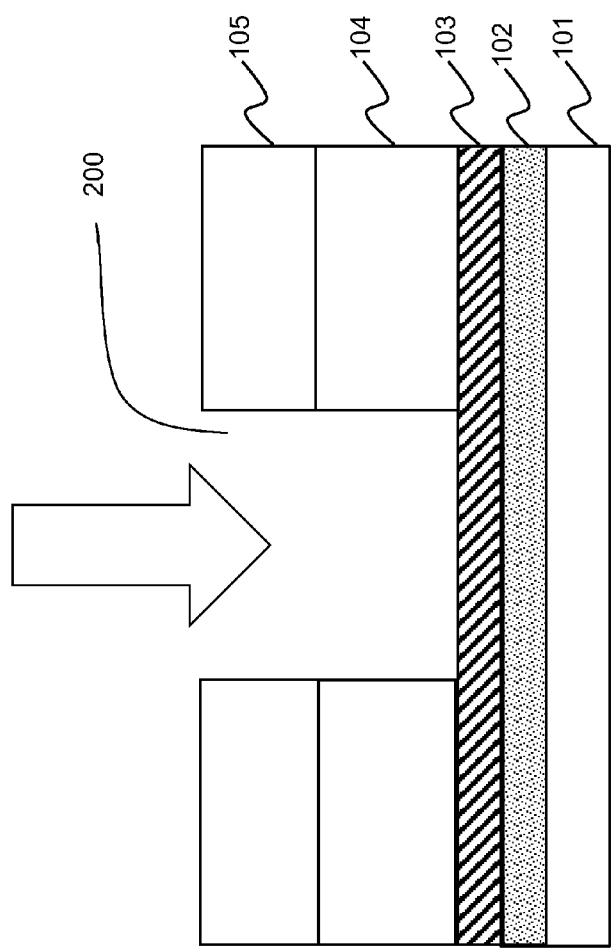
FIG. 4 shows another step of the method.
Figure 5:
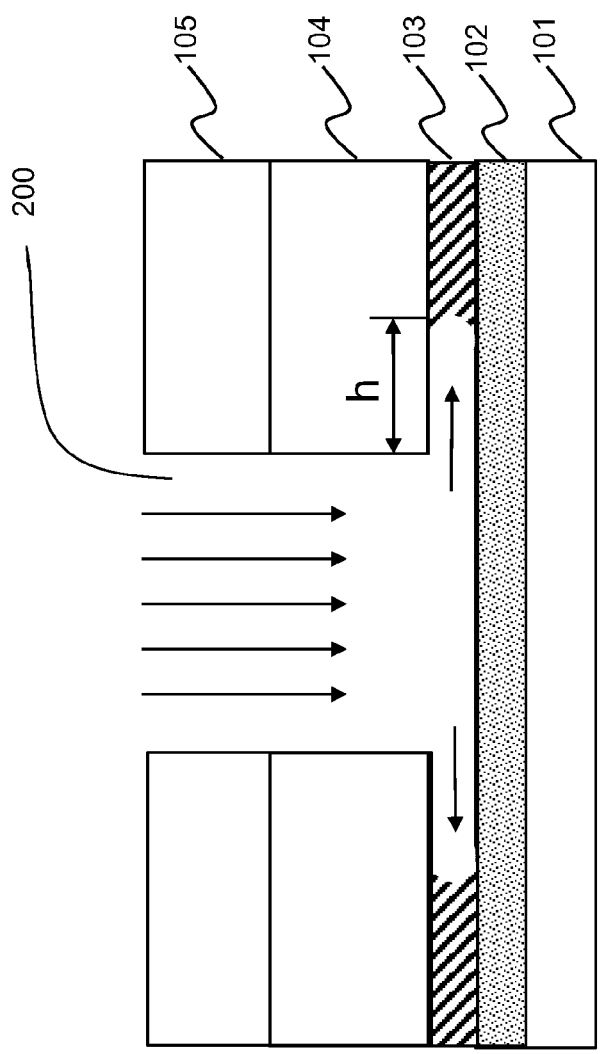
FIG. 5 shows still another step of the method.
Figure 6:
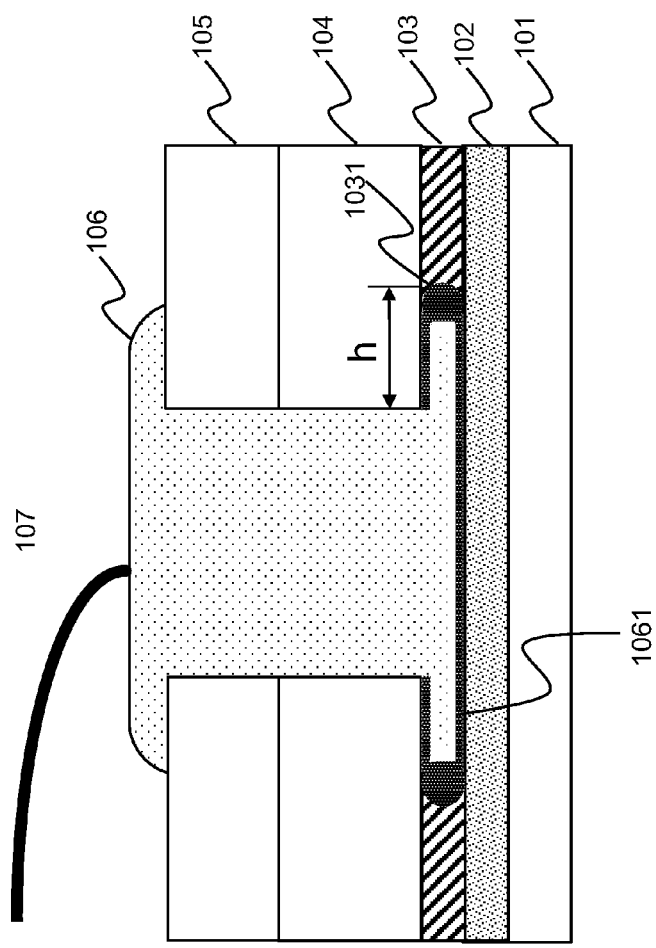
FIG. 6 shows still another step of the method.
Figure 7:
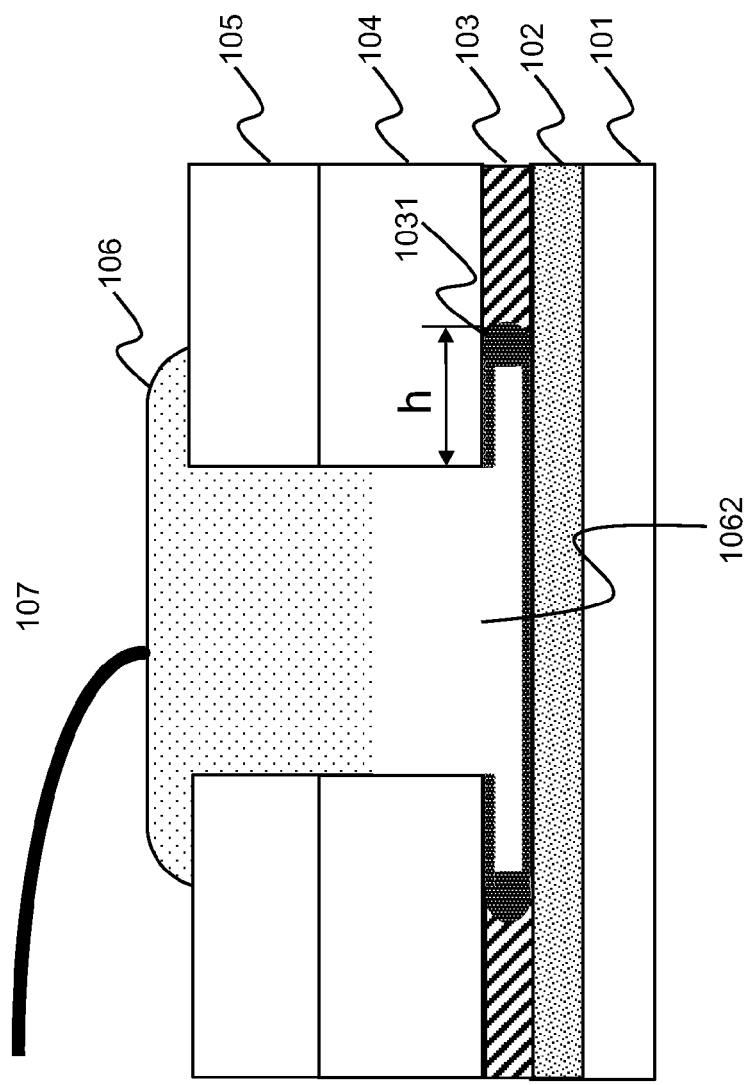
FIG. 7 shows a different formation of a nickel film.

Please see FIG. 2 to FIG. 7. FIG. 2 is a flow chart of a method to form a metal stack contact in electrical communication with aluminum wiring in a semiconductor wafer of an integrated circuit according to the present invention. The rest figures illustrate some steps of the method.

According to the present invention, in the beginning of all steps of the method, it is to form at least one passivation layer on a surface of a semiconductor wafer 101 of an integrated circuit, where an aluminum wiring 103 is embedded (S11). In the embodiment shown in FIG. 3, there are two passivation layers, a first passivation layer 104 and a second passivation layer 105. The semiconductor wafer 101 has a barrier layer 102 beneath the aluminum wiring 103.

The barrier layer 102 is made of TiN. The function of the barrier layer 102 is (1) to prevent diffusion of aluminum atoms from the aluminum wiring 103; (2) to protect the semiconductor wafer 101 from being etched; and (3) to increase adhesion between the aluminum atoms and the passivation layer. In practice, the barrier layer 102 can also be made of TaN, Cr, Ta, W, Ti or a combination of what was disclosed above. The aluminum wiring 103 can be pure aluminum or an aluminum alloy. Most commonly used aluminum alloys are copper-aluminum alloy and aurum-aluminum alloy. The materials for making the aluminum wiring 103 are not limited. In this embodiment, the first passivation layer 104 is made of SiN and the second passivation layer 105 is made of $SiO_2$. Of course, only one passivation layer is workable as long as it can be rigid enough and fulfill above functions. In practice, the passivation layers can be made by other materials, such as $Si_3N_4$ or a combination of what was disclosed above.

Then, one patterned terminal via opening 200 is formed through the passivation layers to expose the aluminum wiring 103 (S12). Any etching process to remove a portion of the first passivation layer 104 and second passivation layer 105 to form the patterned terminal via opening 200 is applicable. Preferably, a photolithography etching is recommended.

Steps S11 and S12 should be done in a fab with conventional IC manufacturing facilities. The following steps are about etching of aluminum and plating of zinc. Since the IC is almost done but only bonding pad is not yet ready, the rest processes can keep going on in a Print-Circuit-Board (PCB) factory and conventional apparatus for manufacturing PCB can apply. Thus, the manufacturing cost of the IC can be saved in this way.

Then, remove a portion of the aluminum wiring 103 from the patterned terminal via opening 200 by chemical etching and form a thin zinc film 1031 on an etched surface at the same time (S13). Chemical etching is processed by using alkaline zincate solution. Namely, there is a chemical reaction as described below when the chemical plating or metal plating processes:

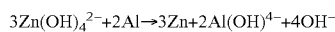

The alkaline zincate solution washes the aluminum wiring 103. Some aluminum atoms become aluminum ions and are washed out. Therefore, an etched portion of the aluminum wiring 103 between the barrier layer 102 and the first passivation layer 104 is formed (etched) by the chemical etching. In fact, any solution which can etch out aluminum atoms and provide zinc ions can be used. For example, $ZnNO_3$ solution is recommended. It should be noticed that the thin zinc film 1031 is formed over the etched portion of the aluminum wiring 103. It helps adjoin a metal stack 106 on the thin zinc film 1031 to take shape a bonding area.

Here, the zincate solution is used for several advantages. First, immersion deposits of nickel and chemical will attack the aluminum wiring 103 to interfere with the good adhesion of the electroless nickel coating. To protect the aluminum surfaces during processing, zinc immersion deposits (zincates) are used. The zinc deposit protects aluminum against re-oxidation from atmospheric exposure and re-dissolves in the electroless nickel solution and exposing the oxide free aluminum wiring 103. Second, one important aspect of the zincating process to be considered is the mechanism of the initiation of the electroless deposition on zincated aluminum surfaces. It initiates an autocatalytic deposition process. In general, residual zinc is found under the nickel layer. Thus, the result can be considered beneficial to the performance of the electroless nickel plating. Last, if possible, a double zincating procedure can be applied to aluminum wiring 103. The benefits of this treatment come from the use of a less critical first zincating step to de-oxidize the aluminum wiring 103 and remove alloying inclusions, while a second zincate treatment can be adjusted to produce a thin, tight zinc deposit on the uniformly conditioned surface.

After the chemical etching finishes, form a nickel film 1061 stacked on the zinc film 1031 (S14). The nickel film 1061 is formed on where there is a group of zinc atoms. It is possible there are some groups of zinc atoms on the patterned terminal via opening200 due to the operation of etching. A trace of nickel might exist there. Comparing with the nickel film 1061 stacked on the zinc film 1031, the quantity of nickel on the patterned terminal via opening 200 is scarce. Preferably, the nickel film is formed by electroplating or electroless plating.

Next, forming the metal stack 106 in the patterned terminal via opening 200 and/or at least a portion of the second passivation layer 140 by (top surface) chemical plating or metal plating (S15). Chemical plating or metal plating is much cheaper than CVD or PVD process and the same results can be available. Copper is used as the material for the metal stack 106. Therefore, the metal stack 106 (contact pad) is a copper contact. In practice, the metal stack may also be made of gold, silver, titanium, chromium, or copper alloy. The thin zinc film 1031 provides a large adjoining plane for the metal stack 106 so that the metal stack 106 can be firmly adjoined. Please refer to FIG. 7. The nickel film 1061 can accommodate copper extended from the metal stack 106. Thus, the metal stack 106 is further sustained by the nickel film 1061 and it makes copper hard to separate from the metal stack 106.

In fact, according to the spirit of the present invention, the nickel film 1061 can be thicker to form a nickel layer. Please see FIG. 7. The nickel layer 1062 is extended to interface a portion of the first passivation layer 104, and then covered by the metal stack 106. It is controlled by the time of the electroplating or electroless plating. In the last step, an electrical interconnection is formed by a gold wiring 107 from the metal stack106 (S16). Namely, the electrical interconnection is a wirebonding or a metal bump. The electrical interconnection may be other metal plating. In practice, the electrical interconnection may use other materials, e. g. conductive paste or conductive ink.

Figure 8:
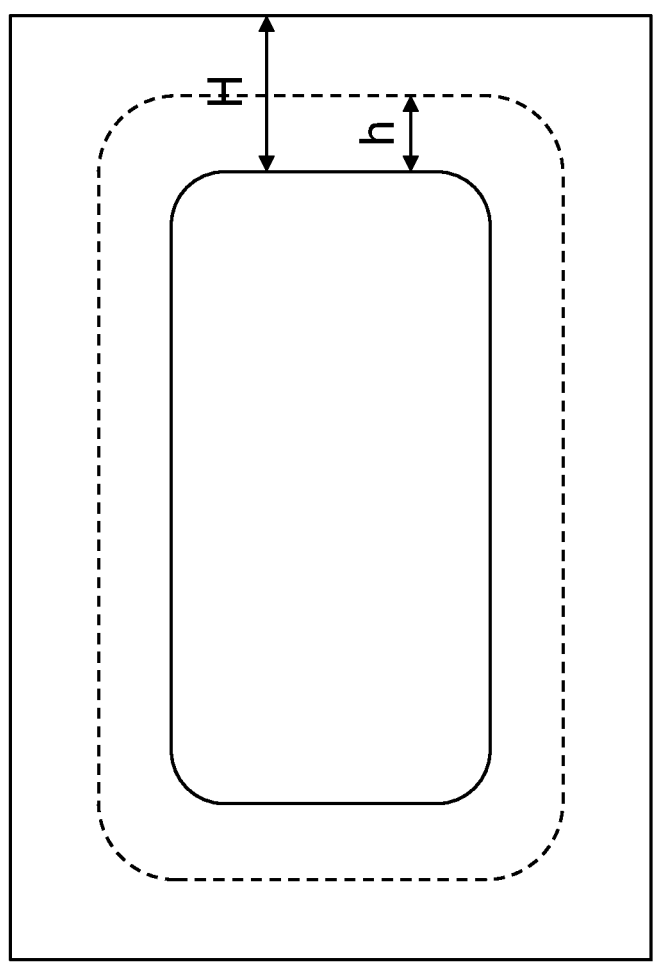
FIG. 8 is a top view of a patterned terminal via opening in an embodiment.

It should be emphasized that the aluminum wiring 103 should have a volume large enough so that after the chemical etching is processed, remained portion of the aluminum wiring 103 still functions normally for the IC. In order to have a better understanding of this point, please refer to FIG. 6 and FIG. 8. FIG. 8 is a top view of the patterned terminal via opening200 in the embodiment. The inner solid contour shows the patterned terminal via opening 200. The dashed line shows a connection of all edge points in the cross-section of an etched side of the aluminum wiring 103. The outer contour shows the peripheral of the aluminum wiring 103. Letter h denotes a distance of one edge point in the cross-section of the etched side of the aluminum wiring 103 to a closest point of the patterned terminal via opening 200. Letter H denotes a distance of same point of the patterned terminal via opening 200 to a closest point of the peripheral of the aluminum wiring 103. h should be less than H so that it means the aluminum wiring 103 is not eaten(etched) through the most external part. In practice, the farthest distance the chemical etching can be applied on would not exceed 5 μm. Therefore, any point in the cross-section of peripheral of the aluminum wiring 103 should be at least 5 μm apart from a closest point in the patterned terminal via opening 200. Meanwhile, the thickness of the aluminum wiring 103 should be greater than 1 μm. Thus, the aluminum wiring 103 will not be eaten through by chemical etching, further causing ill functions of the IC.

Figure 9:
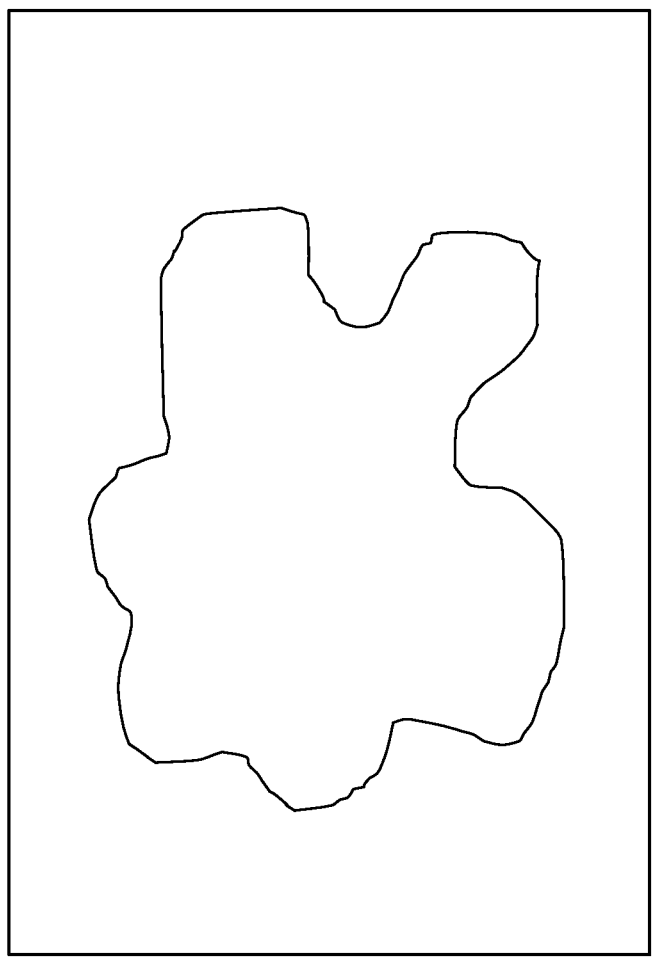
FIG. 9 is a top view of a patterned terminal via opening in another embodiment.
Figure 10:
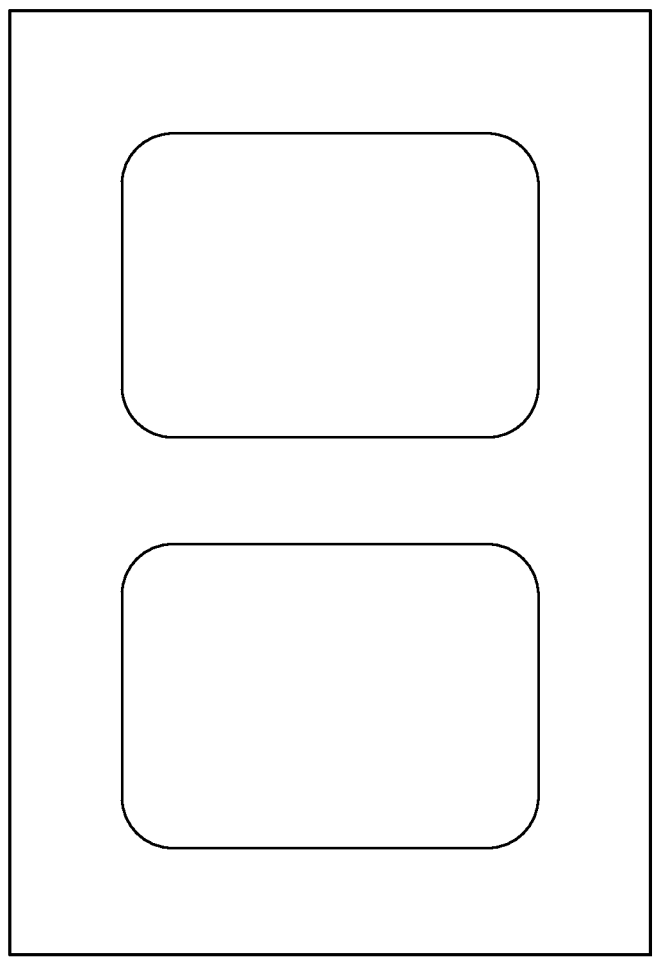
FIG. 10 is a top view of a patterned terminal via opening in still another embodiment.
Figure 11:
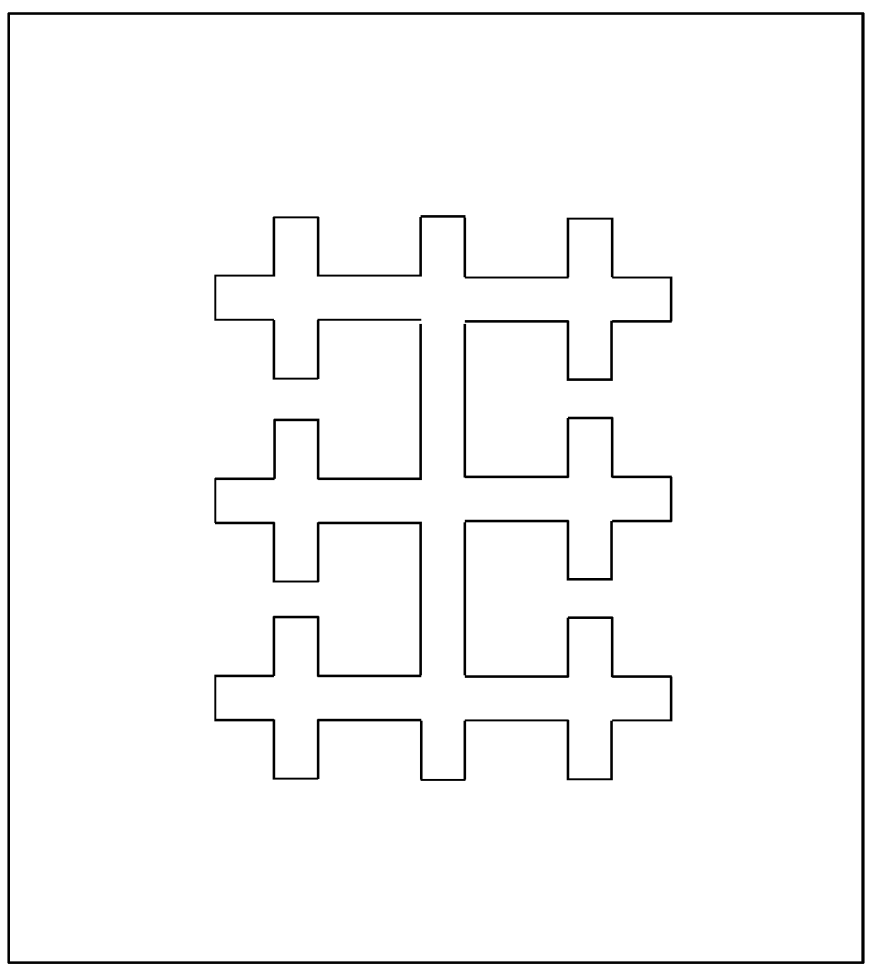
FIG. 11 is a top view of a patterned terminal via opening in still another embodiment.

According to the spirit of the present invention, shape and number of the patterned terminal via opening are not limited. The shape can be regular as shown in FIG. 8 or irregular in FIG. 9. The number of the patterned terminal via opening for one bonding pad can be more than one. FIG. 10 shows there are two patterned terminal via openings created for one bonding pad. Preferably, the patterned terminal via opening should have repeated patterns such as the one shown in FIG. 11, which gives a larger contact surface area between the aluminum wire and the stacked metal than that in FIG. 8. The larger contact surface area improves the conductance at the stacked metal area.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for forming a stacked metal contact in electrical communication with aluminum wiring in a semiconductor wafer of an integrated circuit, comprising the steps of:
   A. forming at least one passivation layer on a surface of the semiconductor wafer of the integrated circuit, where an aluminum wiring is embedded;
   B. forming a patterned terminal via opening through the passivation layer to expose the aluminum wiring;
   C. removing a portion of the aluminum wiring from the patterned terminal via opening by chemical etching and forming a thin zinc film on an etched surface at the same time;
   D. forming a nickel film stacked on the zinc film; and
   E. forming a metal stack in the patterned terminal via opening and/or at least a portion of the passivation layer by chemical plating or metal plating,
   wherein the semiconductor wafer has a barrier layer underneath the aluminum wiring for protecting the semiconductor wafer from being etched;
   wherein a portion of the aluminum wiring between the remaining passivation layer and the barrier layer is etched away to increase the adjoining plane for the metal stack; and
   wherein the thin zinc film is formed along the etched surface of the aluminum wiring between the remaining passivation layer and the barrier layer.

2. The method according to claim 1, wherein the passivation layer is made of $SiO_2$, $Si_3N_4$, SiN or a combination thereof.

3. The method according to claim 1, wherein the aluminum wiring has a volume large enough so that after the chemical etching is processed, the remaining portion of the aluminum wirings still functions normally for the integrated circuit.

4. The method according to claim 3, wherein any point in the cross-section of peripheral of the aluminum wiring is at least 5 μm apart from a closest point in the patterned terminal via opening.

5. The method according to claim 1, wherein the chemical etching is processed by using alkaline zincate solution.

6. The method according to claim 1, wherein the aluminum wiring is made of aluminum or aluminum alloy.

7. The method according to claim 1, wherein the barrier layer is made of TiN, TaN, Cr, Ta, W, Ti or combinations thereof.

8. The method according to claim 1, wherein the nickel film is formed by electroplating or electroless plating.

9. The method according to claim 1, wherein the metal stack is made of gold, silver, titanium, chromium, copper or copper alloy.

10. The method according to claim 1, further comprising a step of: F. forming an electrical interconnection from the metal stack.

11. The method according to claim 10, wherein the electrical interconnection is metal plating.

12. The method according to claim 10, wherein the electrical interconnection is conductive paste or conductive ink.

13. The method according to claim 10, wherein the electrical interconnection is wirebonding or metal bump.

* * * * *